(12) United States Patent
Son

(10) Patent No.: US 11,055,227 B2
(45) Date of Patent: Jul. 6, 2021

(54) CONTROLLER AND OPERATING METHOD THEREOF

(71) Applicant: SK hynix Inc., Gyeonggi-do (KR)

(72) Inventor: Ik Joon Son, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 28 days.

(21) Appl. No.: 16/702,795

(22) Filed: Dec. 4, 2019

(65) Prior Publication Data
US 2020/0310977 A1 Oct. 1, 2020

(30) Foreign Application Priority Data
Apr. 1, 2019 (KR) .................. 10-2019-0037826

(51) Int. Cl.
*G11C 16/10* (2006.01)
*G06F 12/0882* (2016.01)
(Continued)

(52) U.S. Cl.
CPC ...... *G06F 12/0882* (2013.01); *G06F 11/3037* (2013.01); *G06F 12/0246* (2013.01); *G06F 13/1668* (2013.01); *G11C 11/409* (2013.01); *G11C 11/4074* (2013.01); *G11C 11/5628* (2013.01); *G11C 11/5642* (2013.01); *G11C 16/04* (2013.01); *G11C 16/10* (2013.01); *G11C 16/26* (2013.01); *G06F 2212/1016* (2013.01);
(Continued)

(58) Field of Classification Search
CPC ............. G06F 12/0882; G06F 12/0246; G06F 11/3037; G06F 13/1668; G06F 2212/1016; G06F 2212/7203; G06F 2212/7209; G06F 12/0238; G06F 2212/7205; G11C 11/5642; G11C 11/5628; G11C 16/04; G11C 16/26; G11C 16/10; G11C 11/4074; G11C 11/409; G11C 16/3495
See application file for complete search history.

(56) References Cited

U.S. PATENT DOCUMENTS 9,466,384 B1 * 10/2016 Chang .................... G11C 16/16
9,570,159 B1 * 2/2017 Wakchaure ........... G06F 3/0625
(Continued)

FOREIGN PATENT DOCUMENTS

| KR | 100673025 | 1/2007 |
| KR | 1020140057035 | 5/2014 |

*Primary Examiner* — Jay W. Radke
(74) *Attorney, Agent, or Firm* — IP & T Group LLP

(57) ABSTRACT

A controller for controlling a non-volatile memory apparatus including page groups each including a plurality of pages is configured to select a target page group from the page groups, wherein the target page group includes at least one invalid page and at least one valid page, select, as a target threshold voltage distribution, a lower threshold voltage distribution of two adjacent threshold voltage distributions distinguished by an invalid read voltage, wherein the invalid read voltage is a read voltage for distinguishing between data stored in the invalid page, select, as a target memory cell, a memory cell located in the target threshold voltage distribution among a plurality of memory cells configuring the target page group, and control the non-volatile memory apparatus to perform an adjustment program operation for raising a threshold voltage of the target memory cell as much as a first voltage.

19 Claims, 17 Drawing Sheets

(51) Int. Cl.
  *G06F 12/02* (2006.01)
  *G06F 11/30* (2006.01)
  *G11C 11/4074* (2006.01)
  *G11C 11/409* (2006.01)
  *G06F 13/16* (2006.01)
  *G11C 16/26* (2006.01)
  *G11C 16/04* (2006.01)
  *G11C 11/56* (2006.01)

(52) U.S. Cl.
  CPC ............... *G06F 2212/7203* (2013.01); *G06F 2212/7209* (2013.01)

(56) References Cited

U.S. PATENT DOCUMENTS

| | | | |
|---|---|---|---|
| 2010/0329032 A1* | 12/2010 | Lim | G11C 11/5628 365/185.22 |
| 2011/0093652 A1* | 4/2011 | Sharon | G11C 16/10 711/103 |
| 2011/0194353 A1* | 8/2011 | Hwang | G11C 16/12 365/185.19 |
| 2011/0292725 A1* | 12/2011 | Choi | G11C 16/10 365/185.03 |
| 2013/0282958 A1* | 10/2013 | Shepard | G11C 5/005 711/103 |
| 2014/0059406 A1* | 2/2014 | Hyun | G11C 11/5621 714/773 |
| 2014/0101372 A1* | 4/2014 | Jung | G11C 16/26 711/103 |
| 2014/0351487 A1* | 11/2014 | Kim | G11C 16/344 711/103 |
| 2016/0225459 A1* | 8/2016 | Boysan | G11C 5/14 |
| 2017/0076801 A1* | 3/2017 | Shirakawa | G11C 16/08 |
| 2017/0277629 A1* | 9/2017 | Li | G11C 16/3495 |
| 2019/0267091 A1* | 8/2019 | Hong | G11C 16/3431 |

\* cited by examiner

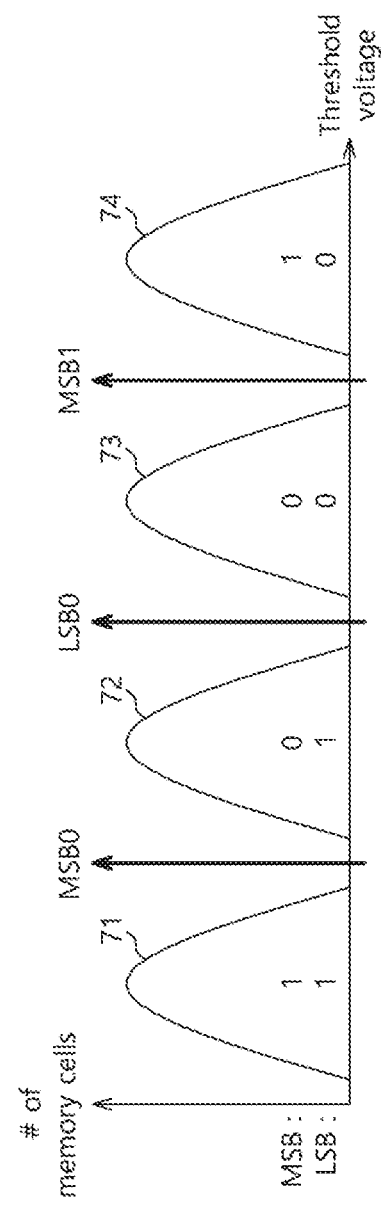

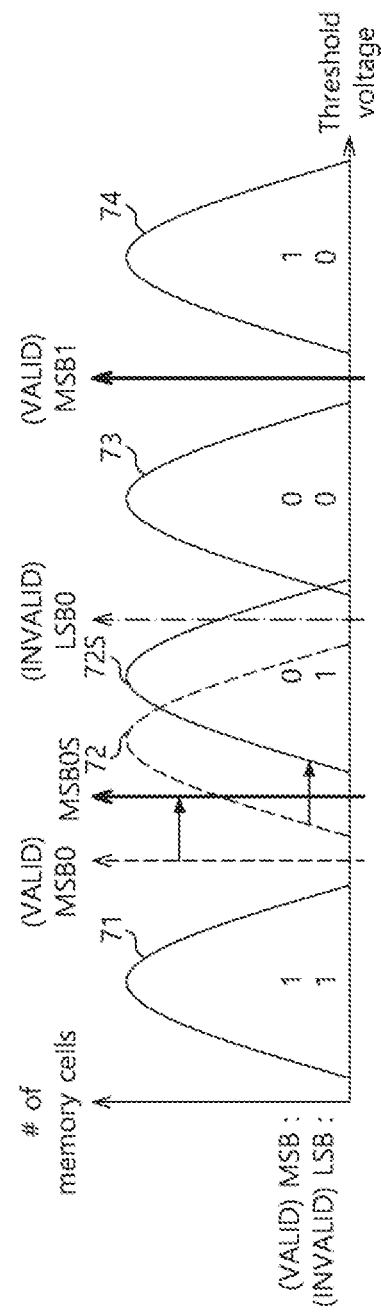

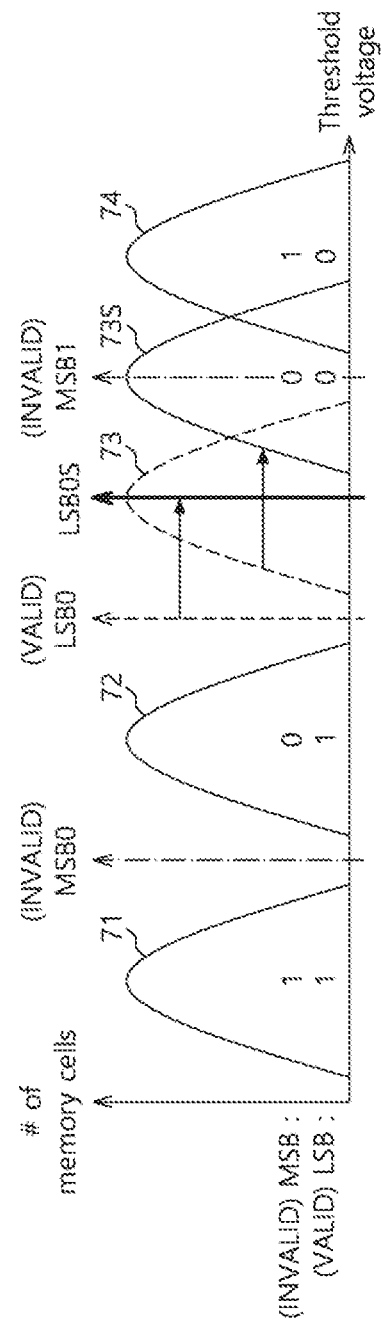

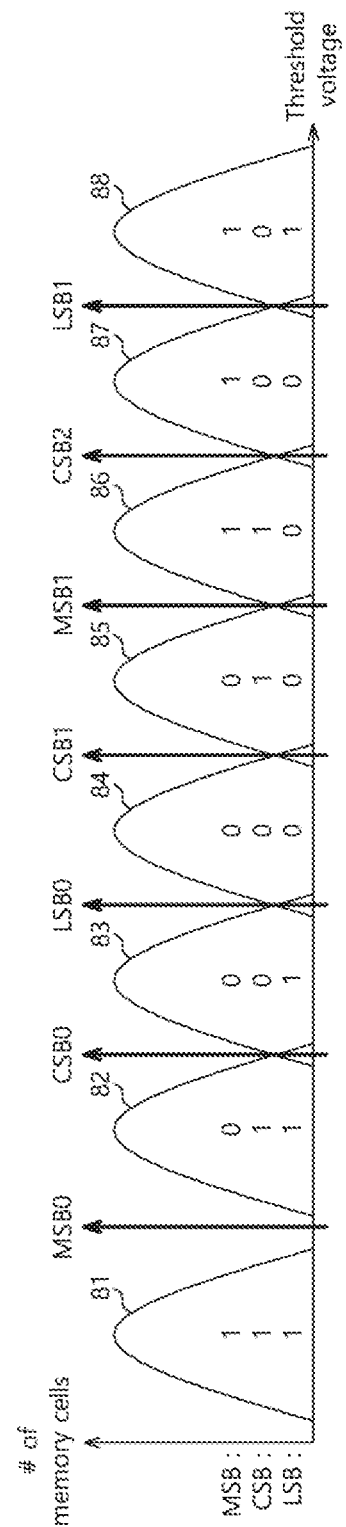

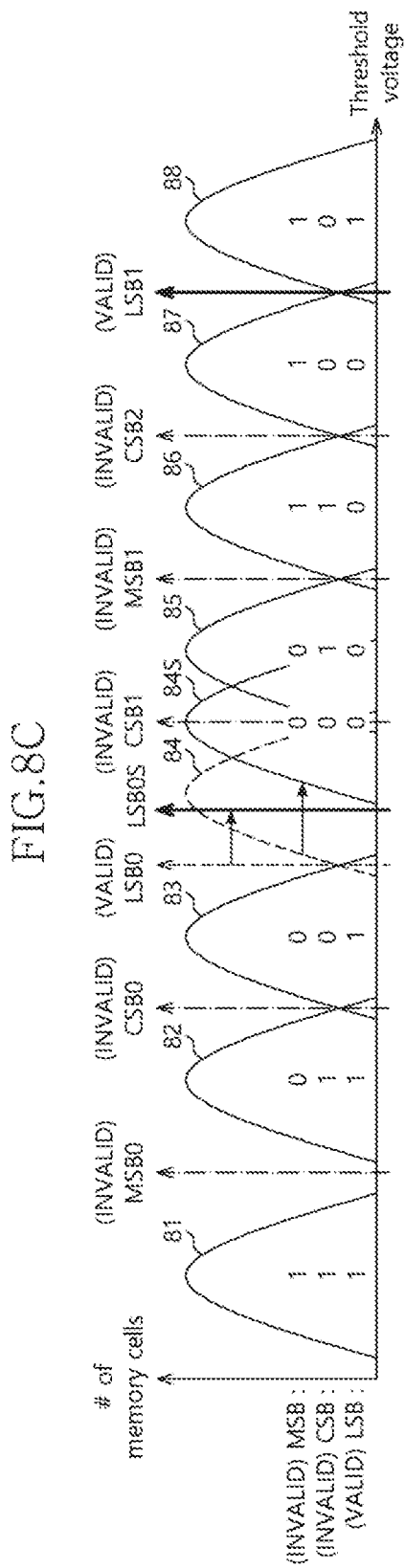

CONTROLLER AND OPERATING METHOD THEREOF

CROSS-REFERENCE TO RELATED APPLICATION

The present application claims priority under 35 U.S.C. § 119(a) to Korean application number 10-2019-0037826, filed on Apr. 1, 2019, in the Korean Intellectual Property Office, which is incorporated herein by reference in its entirety.

BACKGROUND

1. Technical Field

Various embodiments generally relate to a semiconductor apparatus, and more particularly, to a controller of a semiconductor apparatus and an operating method thereof.

2. Related Art

Recently, the paradigm of a computer environment is transitioning to ubiquitous computing in which computer systems can be used anywhere and at any time. Accordingly, the use of portable electronic devices, such as a mobile phone, a digital camera, and a notebook computer, is increasing. In general, such a portable electronic device uses a memory system using a memory apparatus. The memory system is used to store data used in portable electronic devices.

The memory system using the memory apparatus has advantages such as excellent stability and durability, fast information access speed, and low power consumption. The memory system having such advantages includes a universal serial bus (USB) memory apparatus, memory cards having various interfaces, a universal flash storage (UFS) device, and a solid state drive, for example.

SUMMARY

According to the embodiments, a controller for controlling a non-volatile memory apparatus including page groups each including a plurality of pages is configured to select a target page group from the page groups, wherein the target page group includes at least one invalid page and at least one valid page, select, as a target threshold voltage distribution, a lower threshold voltage distribution of two adjacent threshold voltage distributions distinguished by an invalid read voltage, wherein the invalid read voltage is a read voltage for distinguishing between data stored in the invalid page, select, as a target memory cell, a memory cell located in the target threshold voltage distribution among a plurality of memory cells configuring the target page group, and control the non-volatile memory apparatus to perform an adjustment program operation for raising a threshold voltage of the target memory cell as much as a first voltage.

According to the embodiments, a controller for controlling a non-volatile memory apparatus including page groups each including three or more pages is configured to select a target page group from the page groups, wherein the target page group includes at least two invalid pages and at least one valid page, select, as a target threshold voltage distribution, a lower threshold voltage distribution of two adjacent threshold voltage distributions distinguished by respective invalid read voltages, wherein the invalid read voltages are read voltages for distinguishing between data stored in the invalid pages, select, as a target memory cell, a memory cell located in the target threshold voltage distribution among a plurality of memory cells configuring the target page group, and control the non-volatile memory apparatus to perform an adjustment program operation for raising a threshold voltage of the target memory cell as much as a first voltage.

According to the embodiments, a controller for controlling a non-volatile memory apparatus including page groups each including a plurality of pages is configured to select a target page group from the page groups, wherein the target page group includes at least one invalid page and at least one valid page, select, as a target threshold voltage distribution, a threshold voltage distribution located between adjacent valid and invalid read voltages, select, as a target memory cell, a memory cell located in the target threshold voltage distribution among a plurality of memory cells configuring the target page group, and control the non-volatile memory apparatus to perform an adjustment program operation for raising a threshold voltage of the target memory cell.

According to the embodiments, a memory system includes a memory device including multiple level pages of one or more invalid pages and one or more valid pages; and a controller configured to control the memory device to raise a threshold voltage of a memory cell, wherein the threshold voltage is between neighboring lower and first higher read voltages, which respectively identify data stored in the valid and invalid pages, wherein the threshold is raised for a second higher read voltage, which is adjacent to and higher than the first higher read voltage and identifies data stored in the valid pages, to identify data stored in the memory cell of the raised threshold voltage, and wherein the controller is further configured to control the memory device to raise the lower read voltage to identify data stored in the memory cell of the raised threshold voltage.

BRIEF DESCRIPTION OF THE DRAWINGS

FIGS. 7A to 7C are diagrams illustrating program operations according to an embodiment of the present disclosure;

FIGS. 8A to 8C are diagrams illustrating program operations according to an embodiment of the present disclosure;

DETAILED DESCRIPTION

Hereinafter, the controller of a semiconductor apparatus and an operating method thereof will be described below with reference to the accompanying drawings through various embodiments.

Advantages and characteristics of this disclosure and methods of achieving them will be described through embodiments to be described later in detail along with the accompanying drawings. However, this disclosure is not limited to the embodiments described herein, and may be materialized in other forms.

It will be understood that when an element is referred to as being "connected to", or "coupled to" another element, it may be directly on, connected to, or coupled to the other element, or one or more intervening elements may be present. It will be further understood that the terms "comprises," "comprising," "includes," and "including" when used in this specification, specify the presence of the stated elements and do not preclude the presence or addition of one or more other elements.

Various embodiments of this disclosure are described below in detail with reference to the accompanying drawings. It is to be noted that the same reference numbers are used throughout the drawings to refer to the same elements.

As used herein, singular forms may include the plural forms, unless the context clearly indicates otherwise. The articles 'a' and 'an' as used in this application and the appended claims should generally be construed to mean 'one or more' unless specified otherwise or clear from context to be directed to a singular form.

It is noted that reference to "an embodiment," "another embodiment" or the like does not necessarily mean only one embodiment, and different references to any such phrase are not necessarily to the same embodiment(s).

Hereinafter, various embodiments of this disclosure are described with reference to the accompanying drawings.

Figure 1:
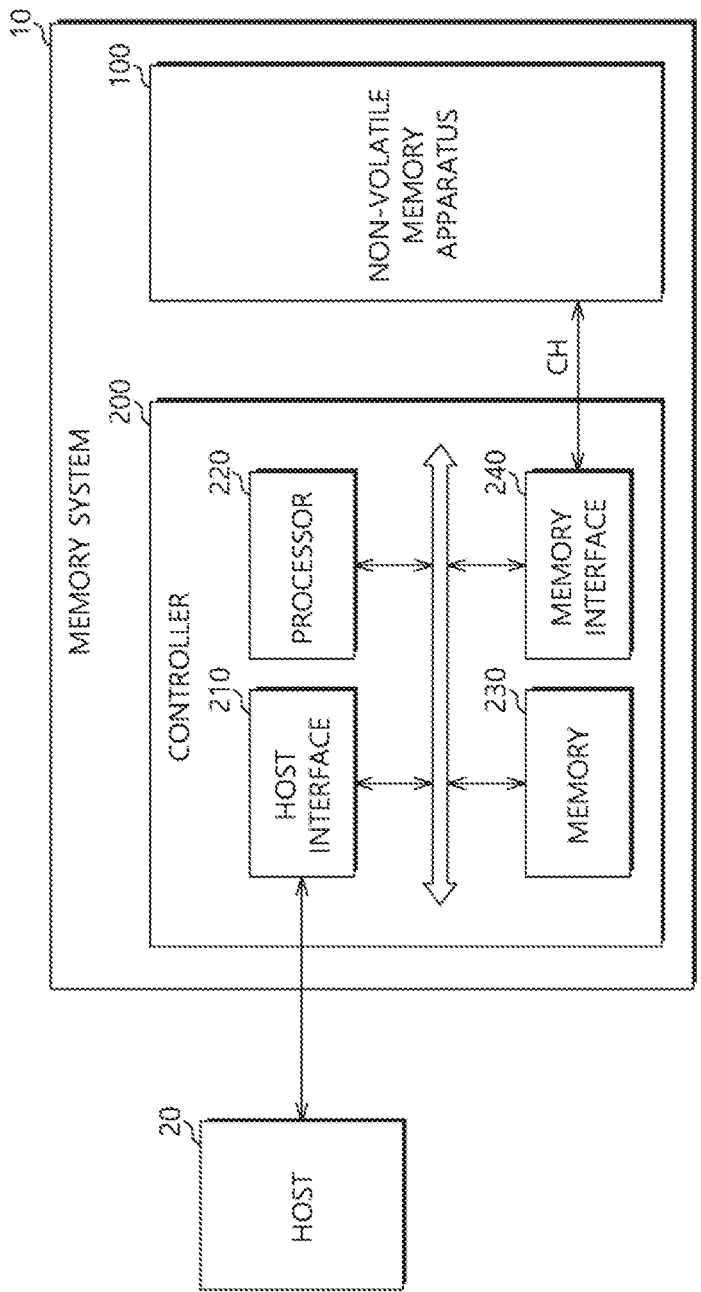
FIG. 1 is a diagram illustrating a configuration of a memory system according to an embodiment of the present disclosure.

FIG. 1 is a diagram illustrating a configuration of a memory system 10 according to an embodiment of the present disclosure.

Referring to FIG. 1, the memory system 10 according to the present embodiment may store data accessed by a host 20, such as a mobile phone, an MP3 player, a laptop computer, a desktop computer, a game machine, TV or an in-vehicle infotainment system.

The memory system 10 may be fabricated as any one of various types of storage apparatuses according to an interface protocol electrically coupled to the host 20. For example, the memory system 10 may be configured as any one of various types of storage apparatuses, such as a multimedia card of a solid state drive (SSD), MMC, eMMC, RS-MMC or micro-MMC form, a secure digital card of an SD, mini-SD or micro-SD form, a storage apparatus of a universal serial bus (USB) storage apparatus, universal flash storage (UFS) apparatus or personal computer memory card international association (PCMCIA) card form, a storage apparatus of a peripheral component interconnection (PCI) card form, a storage apparatus of a PCI-express (PCI-E) card form, a compact flash (CF) card, a smart media card, and a memory stick.

The memory system 10 may be fabricated as any one of various types of package forms. For example, the memory system 10 may be fabricated as any one of various types of package forms, such as a package on package (POP), a system in package (SIP), a system on chip (SOC), a multi-chip package (MCP), a chip on board (COB), a wafer-level fabricated package (WFP), and a wafer-level stack package (WSP).

The memory system 10 may include a non-volatile memory apparatus 100 and a controller 200.

The non-volatile memory apparatus 100 may operate as a storage medium of the memory system 10. The non-volatile memory apparatus 100 may be configured as any one of various forms of non-volatile memory apparatuses, such as a NAND flash memory apparatus, a NOR flash memory apparatus, a ferroelectric random access memory (FRAM) using a ferroelectric capacitor, a magnetic random access memory (MRAM) using a tunneling magneto-resistive (TMR) film, a phase change random access memory (PRAM) using chalcogenide alloys, and a resistive random access memory (ReRAM) using transition metal oxides, depending on memory cells.

In FIG. 1, the memory system 10 has been illustrated as including one non-volatile memory apparatus 100, but the memory system 10 may include a plurality of non-volatile memory apparatuses. Accordingly, this disclosure may also be applied to the memory system 10 including the plurality of non-volatile memory apparatuses.

The non-volatile memory apparatus 100 may include a memory cell array (not illustrated) having a plurality of memory cells disposed at respective regions where a plurality of bit lines (not illustrated) intersects with a plurality of word lines (not illustrated). The memory cell array may include a plurality of memory blocks. Each of the plurality of memory blocks may include a plurality of page groups. Each of the page groups is configured with N pages. In this case, N may be determined by the number of bits N which may be stored in a memory cell. For example, if a memory cell is a triple level cell (TLC) capable of storing 3 bits, a page group may be configured with the least significant bit (LSB) page, a center significant bit (CSB) page and the most significant bit (MSB) page. Furthermore, if a memory cell is a multi-level cell (MLC) capable of storing two bits, a page group may be configured with an LSB page and an MSB page.

For example, each of the memory cells of a memory cell array may be a single level cell (SLC) capable of storing data of 1 bit or a memory cell capable of storing data of two bits or more. In some embodiments, a memory cell in which data of two bits is stored may be called an MLC. A memory cell in which data of three bits is stored may be called a TLC. A memory cell in which data of 4 bits may be called a quad level cell (QLC).

The memory cell array may include one or more memory cells. Furthermore, the memory cell array may include memory cells having a two-dimensional horizontal structure or memory cells having a three-dimensional vertical structure.

The controller 200 may control an overall operation of the memory system 10 through the driving of firmware or software loaded onto a memory 230. The controller 200 may decode and drive an instruction or algorithm of a code form, such as firmware or software. The controller 200 may be implemented as hardware or in a form in which hardware and software are combined.

The controller 200 may include a host interface 210, a processor 220, the memory 230 and a memory interface 240. Although not illustrated in FIG. 1, the controller 200 may further include an ECC engine for generating a parity by performing error correction code (ECC) encoding on data provided by the host 20 and performing ECC decoding on data read from the non-volatile memory apparatus 100 using the parity.

The host interface 210 may interface between the host 20 and the memory system 10 in accordance with a protocol of the host 20. For example, the host interface 210 may communicate with the host 20 through any one of protocols such as a universal serial bus (USB), a universal flash storage (UFS), a multimedia card (MMC), a parallel advanced technology attachment (PATA), a serial advanced technology attachment (SATA), a small computer system interface (SCSI), a serial attached SCSI (SAS), a peripheral component interconnection (PCI), and a PCI express (PCI-E).

The processor 220 may be configured as a micro control unit (MCU) or a central processing unit (CPU). The processor 220 may process a request from the host 20. In order to process a request from the host 20, the processor 220 may drive an instruction or algorithm of a code form loaded onto the memory 230, that is, firmware, and may control internal function blocks, such as the host interface 210, the memory 230, and the memory interface 240, and the non-volatile memory apparatus 100.

The processor 220 may generate control signals to control an operation of the non-volatile memory apparatus 100 based on requests from the host 20, and may provide the generated control signals to the non-volatile memory apparatus 100 through the memory interface 240.

The memory 230 may be configured as a random access memory, such as a dynamic random access memory (DRAM) or a static random access memory (SRAM). The memory 230 may store firmware driven by the processor 220. Furthermore, the memory 230 may store data necessary to drive firmware, for example, meta data. That is, the memory 230 may operate as a working memory of the processor 220.

The memory 230 may be configured to include a data buffer for temporarily storing data to be transmitted from the host 20 to the non-volatile memory apparatus 100 or data to be transmitted from the non-volatile memory apparatus 100 to the host 20. That is, the memory 230 may operate as a buffer memory.

The memory interface 240 may control the non-volatile memory apparatus 100 under the control of the processor 220. The memory interface 240 may also be called a memory controller. The memory interface 240 may provide control signals to the non-volatile memory apparatus 100. The control signals may include a command, an address, and an operation control signal for controlling the non-volatile memory apparatus 100. The memory interface 240 may provide the non-volatile memory apparatus 100 with data stored in the memory 230, or may store data, transmitted by the non-volatile memory apparatus 100, in the memory 230.

Figure 2:
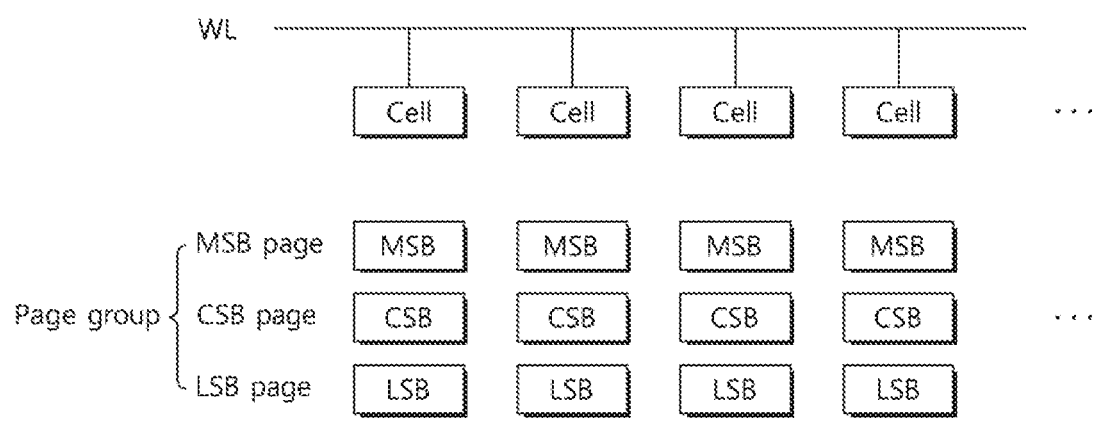
FIG. 2 is a diagram illustrating a data storage region included in a non-volatile memory apparatus according to an embodiment of the present disclosure.

FIG. 2 is a diagram illustrating a page group according to an embodiment of the present disclosure.

Referring to FIG. 2, a page group configured with memory cells, that is, TLCs is illustrated as an example. The page group may be configured with a plurality of memory cells that physically share a word line WL. If each of the memory cells is a TLC, the memory cell can store three bits, that is, an MSB, a CSB and an LSB. Accordingly, the page group may logically include an MSB page in which the MSBs of memory cells are stored, a CSB page in which the CSBs of memory cells are stored, and an LSB page in which the LSBs of memory cells are stored.

That is, the page group configured with memory cells each capable of storing N bits may be configured with N pages.

Figure 3:
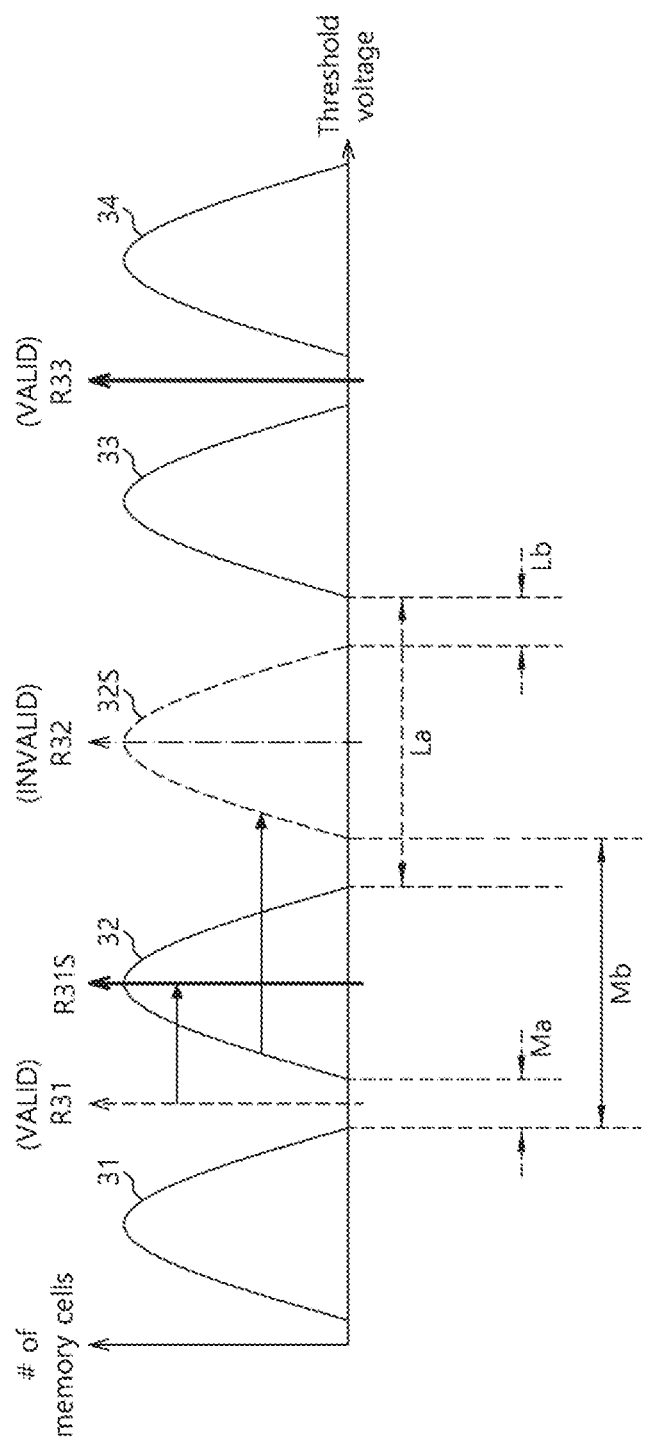
FIG. 3 is a diagram illustrating a program operation according to an embodiment of the present disclosure.

FIG. 3 is a diagram illustrating an adjustment program operation according to an embodiment of this disclosure. FIG. 3 illustrates four threshold voltage distributions 31 to 34 of the threshold voltage distributions of memory cells, such as MLCs, TLCs, or QLCs. Memory cells having threshold voltages belonging to the threshold voltage distributions 31 to 34 may store data corresponding to those threshold voltage distributions.

Read voltages R31 to R33 may be used to determine to which threshold voltage distributions threshold voltages of memory cells belong. That is, the read voltages R31 to R33 may be used to determine data stored in memory cells and to read that corresponding data. The read voltages R31 to R33 may be between the threshold voltage distributions 31 to 34 in order to distinguish the threshold voltage distributions 31 to 34. The read voltages R31 to R33 may identify the threshold voltage distributions 31 to 34. For example, the read voltage R31 may be between the threshold voltage distributions 31 and 32 in order to distinguish the adjacent threshold voltage distributions 31 and 32. The read voltage R32 may be between the threshold voltage distributions 32 and 33 in order to distinguish the adjacent threshold voltage distributions 32 and 33. The read voltage R33 may be between the threshold voltage distributions 33 and 34 in order to distinguish the adjacent threshold voltage distributions 33 and 34.

If all the pages of a page group are valid pages in which valid data is stored, the read voltages R31 to R33 may be defined as valid read voltages. That is, a valid read voltage may be a read voltage used to read data stored in a valid page.

If valid data stored in a valid page becomes invalid data, the corresponding valid page may become an invalid page. For example, data read by distinguishing the threshold voltage distributions 32 and 33 may be invalid data. In such a case, the threshold voltage distributions 32 and 33 may not need to be distinguished. The read voltage R32 located between the threshold voltage distributions 32 and 33 may be defined as an invalid read voltage. That is, the invalid read voltage R32 may be defined as a read voltage used to read data stored in an invalid page.

The memory system 10 of the present disclosure may improve read performance of the memory system 10 by reducing the interval between the threshold voltage distributions 32 and 33 that do not need to be distinguished and increasing other neighboring intervals. For example, the memory system 10 may shift the threshold voltage distribution 32 toward the threshold voltage distribution 33 to a threshold voltage distribution 32S. In other words, the memory system 10 may increase the threshold voltages of memory cells located in the threshold voltage distribution 32.

Accordingly, the interval between the threshold voltage distributions 31 and 32 may be increased from Ma to Mb. The interval between the threshold voltage distributions 32 and 33 may be decreased from La to Lb. As a result, upon read operation, there may be a lower possibility that a memory cell having a threshold voltage belonging to the shifted threshold voltage distribution 32S will be determined as having a threshold voltage belonging to the threshold voltage distribution 31. That is, performance of a read operation by the memory system 10 can be enhanced because memory cells located in the threshold voltage distribution 31 and memory cells located in the threshold voltage distribution 32 are distinguished from each other when the read operations on the memory cells are performed.

Furthermore, the memory system 10 may increase the valid read voltage R31 in order to distinguish between the threshold voltage distributions 31 and 32. As a result, if a read operation is performed using an adjusted read voltage R31S, it is possible to further lower a possibility that the threshold voltage distribution 31 will be determined as a shifted threshold voltage distribution 32S.

Figure 4:
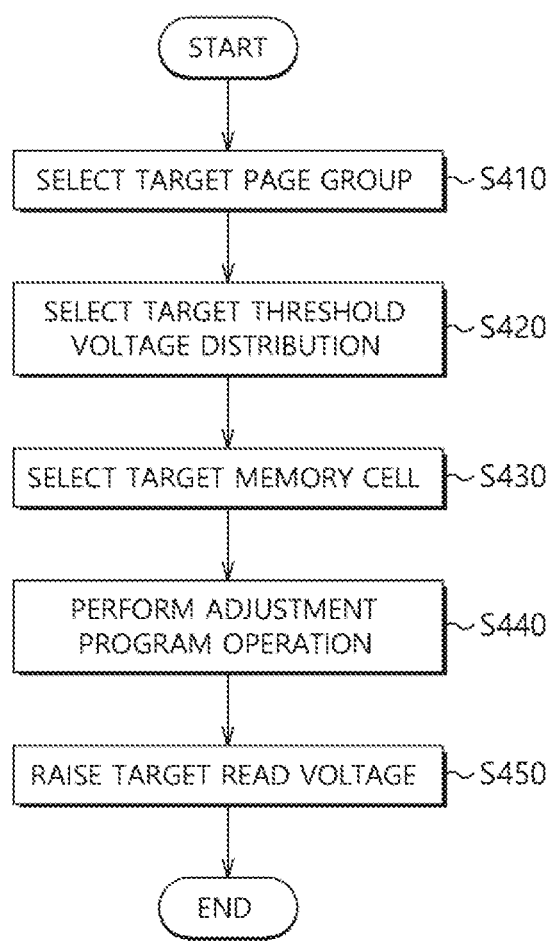
FIGS. 4 to 6 are flow charts illustrating operations of the memory system according to an embodiment of the present disclosure.

FIG. 4 is a flow chart illustrating an operation of the memory system according to an embodiment of the present disclosure.

Referring to FIG. 4, at step S410, the memory system 10 may select a target page group. The target page group may mean a page group including at least one invalid page and at least one valid page. That is, the target page group may be a page group in a partially invalid state. The controller 200 may select the target page group from a plurality of page groups included in the non-volatile memory apparatus 100.

In an embodiment, the controller 200 may manage information indicating whether a page is valid or invalid and select a target page group based on the corresponding information.

In an embodiment, if a plurality of memory cells configuring a page group is MLCs (that is, memory cells capable of storing two bits of data), the controller 200 may select, as a target page group, a page group in which any one of an LSB page and an MSB page is an invalid page.

In an embodiment, if a plurality of memory cells configuring a page group is TLCs, the controller 200 may select, as a target page group, a page group in which any one or two of an LSB page, a CSB page and an MSB page are invalid pages.

At step S420, the memory system 10 may select a target threshold voltage distribution. The target threshold voltage distribution may be a threshold voltage distribution to be shifted to increase a read margin.

The target threshold voltage distribution may be adjacent to a valid read voltage in a voltage decrease direction (i.e., the left direction in FIG. 3) and to an invalid read voltage in a voltage increase direction (i.e., the right direction in FIG. 3).

In some embodiments (see FIG. 8C), a target threshold voltage distribution may be a lower threshold voltage distribution (e.g., a threshold voltage distribution 84) among higher and lower adjacent threshold voltage distributions (e.g., threshold voltage distributions 84 and 85) distinguished by an invalid read voltage (e.g., an invalid read voltage CSB1).

That is, the target threshold voltage distribution may be between neighboring lower and higher read voltages, which respectively identify data stored in the valid and invalid pages.

At least one invalid page may be specified once a target page group is selected, and at least one invalid read voltage may be specified once the invalid page is specified. Accordingly, a target threshold voltage distribution may also be specified.

At step S430, the memory system 10 may select at least one target memory cell. For example, the controller 200 may select, as a target memory cell, at least one memory cell that belongs to a plurality of memory cells configuring a target page group and that is located in a target threshold voltage distribution.

In an embodiment, the controller 200 may select a target memory cell based on the results of the execution of a read operation on a target page group. For example, the controller 200 may control the non-volatile memory apparatus 100 to perform a read operation on a target page group, and may check the threshold voltage distributions of a plurality of memory cells, configuring the target page group, based on a read result transmitted by the non-volatile memory apparatus 100. The read result may include information on threshold voltage distributions in which the plurality of memory cells is located or information on data stored in the memory cells.

In an embodiment, the controller 200 may omit an ECC decoding operation when performing a read operation on a plurality of memory cells configuring a target page group.

At step S440, the memory system 10 may perform an adjustment program operation on the target memory cell. For example, the controller 200 may perform an adjustment program operation on a target memory cell by controlling the non-volatile memory apparatus 100 to increase the threshold voltage of the target memory cell. The non-volatile memory apparatus 100 may select a target memory cell from a plurality of memory cells configuring a target page group, and may increase the threshold voltage of the target memory cell. If the threshold voltage of the target memory cell is increased, a target threshold voltage distribution may be shifted to the right (i.e., voltage increase direction).

In an embodiment, the controller 200 may control the non-volatile memory apparatus 100 to increase the threshold voltage of a target memory cell by a first voltage.

In an embodiment, the first voltage may be a voltage greater than 0 and may be set such that the threshold voltage of a target memory cell does not exceed, after an adjustment program operation is performed, a voltage range of a higher threshold voltage distribution (e.g., the threshold voltage distribution 33 of FIG. 3) among adjacent lower and higher threshold voltage distributions (e.g., the threshold voltage distributions 32 and 33, respectively) distinguished by an invalid read voltage (e.g., the invalid read voltage R32).

In an embodiment, the first voltage may be a voltage greater than 0 and may be set such that the threshold voltage of a target memory cell becomes, after an adjustment program operation is performed, higher than the invalid read voltage (e.g., the invalid read voltage R32).

In an embodiment, the first voltage may be variously set depending on the number of data bits, respectively, stored in a plurality of memory cells configuring a target page group, that is, depending on whether the memory cells are MLCs, TLCs or QLCs. Furthermore, the first voltage may be variously set depending on a target threshold voltage distribution selected among threshold voltage distributions to which threshold voltages of a plurality of memory cells configuring a target page group belong.

In an embodiment, the controller 200 may add data, indicating that an adjustment program operation has been performed, to map data for a target page group on which the adjustment program operation has been performed.

At step S450, the memory system 10 may raise a target read voltage. The target read voltage may be a valid read voltage that belongs to the valid read voltages of a target page group and that is adjacent to and has a lower voltage level than a target threshold voltage distribution. In other words, the target read voltage may be the highest valid read voltage of valid read voltages lower than an invalid read voltage adjacent to a target threshold voltage distribution.

The controller 200 may raise a target read voltage by a second voltage.

In an embodiment, the second voltage may be a voltage greater than 0 and may be set to raise the target read voltage (e.g., the read voltage R31 of FIG. 3) to have a voltage level (e.g., the voltage level of the read voltage R31S) between a shifted target threshold voltage distribution (e.g., the shifted target threshold voltage distribution 32S) and a lower threshold voltage distribution (e.g., the threshold voltage distribution 31) adjacent to the target read voltage.

In an embodiment, the second voltage may be variously set depending on the number of data bits, respectively, stored in a plurality of memory cells configuring a target page group, that is, whether the memory cells are MLCs, TLCs or QLCs. Furthermore, the second voltage may be variously set depending on a target threshold voltage distribution selected among threshold voltage distributions to which threshold voltages of a plurality of memory cells configuring a target page group belong. Furthermore, the second voltage may be variously set depending on the first voltage.

The controller 200 may control the non-volatile memory apparatus 100 to use a raised target read voltage, that is, an adjusted read voltage, instead of a target read voltage, when performing a read operation on a valid page included in a target page group.

Figure 5:
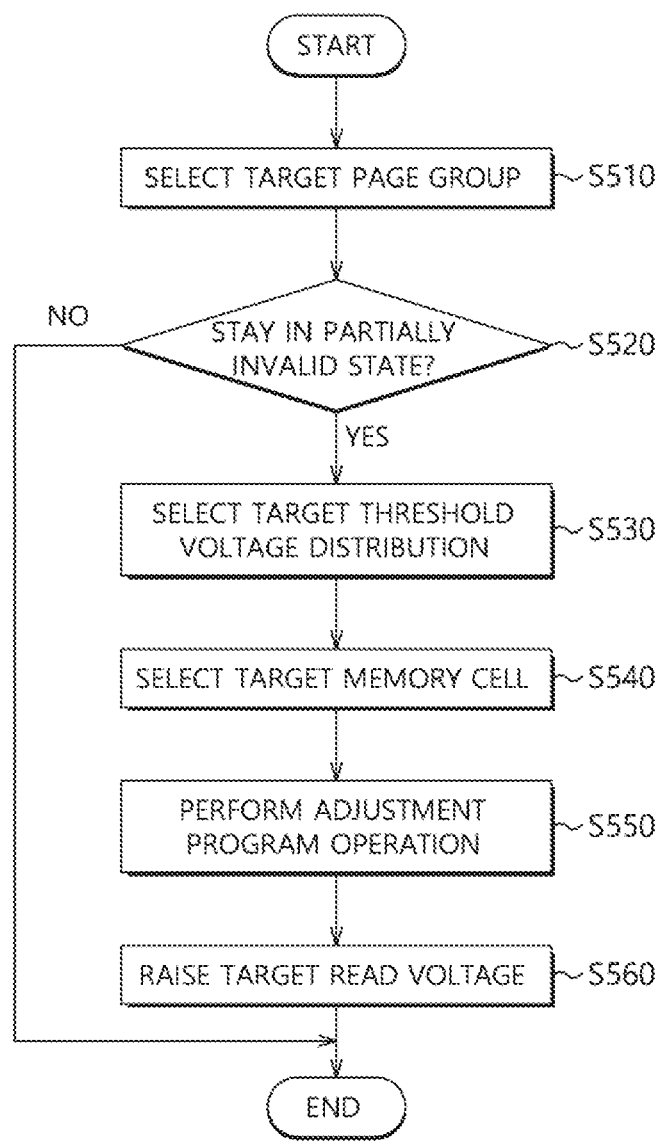

FIG. 5 is a diagram for illustrating an operation of the memory system according to an embodiment of this disclosure. Steps S510, S530, S540, S550 and S560 in FIG. 5 may be substantially similar as steps S410, S420, S430, S440 and S450 in FIG. 4, respectively. Accordingly, step S520 is described with reference to FIG. 5, and descriptions of steps S510, S530, S530, S540 and S560 will be omitted.

Referring to FIG. 5, at step S520, the memory system 10 may determine whether the target page group is to stay in a partially invalid state. The partially invalid state may be a state in which the target page group includes at least one invalid page and at least one valid page. If a target page group is not in a partially invalid state, this may mean that all pages included in the target page group will change to invalid pages.

In an embodiment, the controller 200 may determine that a target page group will stay in a partially invalid state based on whether cold data has been stored in the target page group. For example, if cold data has been stored in at least one valid page included in a target page group, the controller 200 may determine that the target page group will stay in a partially invalid state. That is, since the cold data is not frequently updated, it is highly likely to continue to be maintained as valid data. On the contrary, if hot data has been stored in at least one valid page included in a target page group, the controller 200 may determine that the target page group will not stay in a partially invalid state. That is, since the hot data is frequently updated, it is highly likely to change to invalid data within a short period of time.

In an embodiment, the controller 200 may determine that a target page group will stay in a partially invalid state based on a time interval (in other words, amount of time) for each of invalid pages included in the target page group to be sequentially invalidated. The time interval may mean from when one page becomes invalid to when another page becomes invalid. For example, if invalid pages included in a target page group became sequentially invalid at a time interval greater than a first amount of time, the controller 200 may determine that the target page group will stay in a partially invalid state. Furthermore, if invalid pages included in a target page group became sequentially invalid at a time interval smaller than the first amount of time, the controller 200 may determine that the target page group will not stay in a partially invalid state. As an example, the first amount of time may be set in the fabrication step of the memory system 10. As another example, the first amount of time may be set in the use step of the memory system 10.

In an embodiment, if at least a second amount of time elapses from a recent invalidation time of a target page group, the controller 200 may determine that the target page group will stay in a partially invalid state. The recent invalidation time may mean the time (i.e., amount of time) when a most recently invalidated page is invalidated among the invalid pages included in the target page group. Furthermore, if at least the second amount of time does not elapse from the recent invalidation time of a target page group, the controller 200 may determine that the target page group will stay in a partially invalid state. As an example, the second amount of time may be set in the fabrication step of the memory system 10. As another example, the second amount of time may be set in the use step of the memory system 10.

Figure 6:
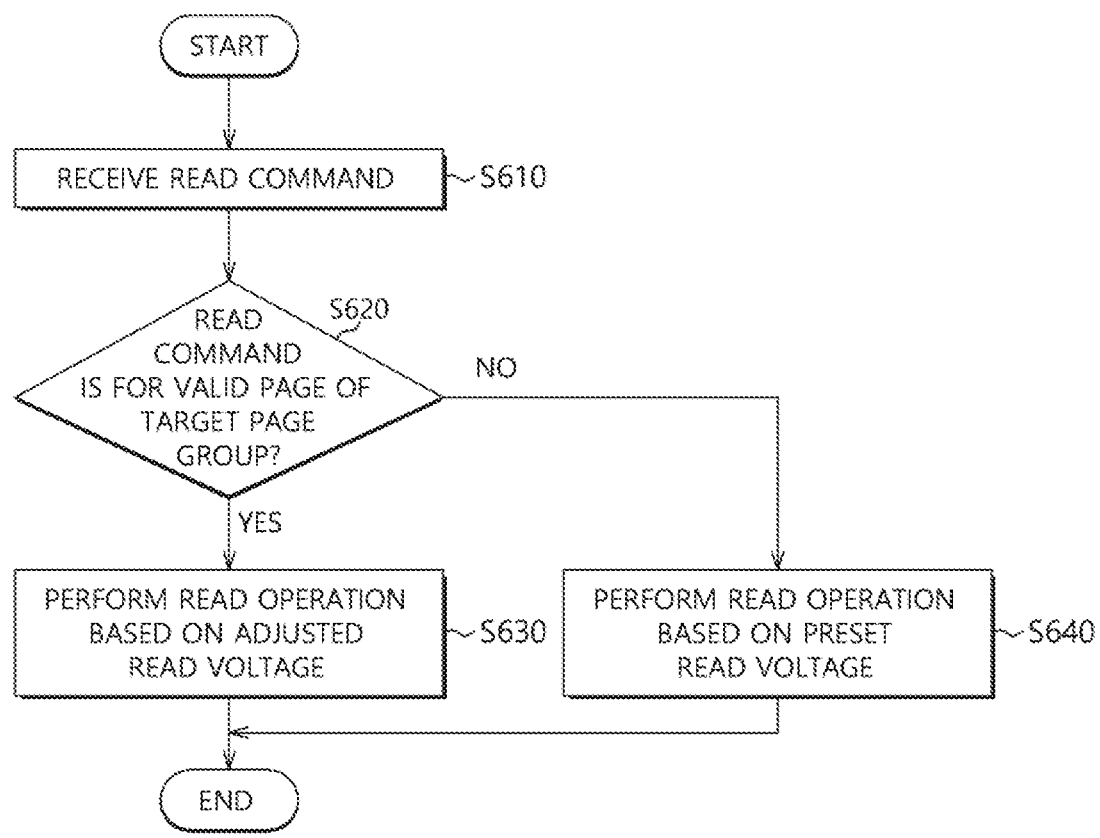

FIG. 6 is a flow chart illustrating an operating method of the memory system according to an embodiment of the present disclosure.

Referring to FIG. 6, at step S610, the controller 200 may receive a read command from the host 20.

At step S620, the controller 200 may determine whether the read command is for a valid page of a target page group on which an adjustment program operation has been performed.

In an embodiment, the controller 200 may confirm whether a read command is for a valid page of a target page group on which an adjustment program operation has been performed, based on information stored in map data and indicating whether the adjustment program operation has been performed.

At step S630, the memory system 10 may perform a read operation based on an adjusted read voltage. For example, if a read command is for a valid page of a target page group on which an adjustment program operation has been performed (YES at step S620), the controller 200 may control the non-volatile memory apparatus 100 to perform a read operation based on an adjusted read voltage having a raised target read voltage in the adjustment program operation.

At step S640, the memory system 10 may perform a read operation based on a preset read voltage. For example, if a read command is not for a valid page of a target page group on which an adjustment program operation has been performed (NO at step S620), the controller 200 may control the non-volatile memory apparatus 100 to perform a read operation based on a preset read voltage.

FIGS. 7A to 7C are diagrams illustrating operations of the memory system according to an embodiment of the present disclosure.

FIG. 7A illustrates an example of four threshold voltage distributions 71 to 74 formed by memory cells configuring a page group if the memory cells are MLCs (i.e., memory cells capable of storing two bits of data). The threshold voltage distribution 71 may be formed by memory cells in which data "11", for example, is stored. The threshold voltage distribution 72 may be formed by memory cells in which data "01", for example, is stored. The threshold voltage distribution 73 may be formed by memory cells in which data "00", for example, is stored. The threshold voltage distribution 74 may be formed by memory cells in which data "10", for example, is stored.

The threshold voltage distributions 71 to 74 may be distinguished by preset read voltages MSB0, LSB0, and MSB1. The read voltage LSB0 may be used to read data stored in the LSB page by distinguishing between the threshold voltage distributions 72 and 73. The read voltages MSB0 and MSB1 may be used to read data stored in the MSB pages by distinguishing between the threshold voltage distributions 71 and 72 and between the threshold voltage distributions 73 and 74, respectively.

FIG. 7B illustrates a method of performing an adjustment program operation when an LSB page is an invalid page and MSB pages are valid pages. Since the LSB page is an invalid page, the read voltage LSB0 may be an invalid read voltage and the read voltages MSB0 and MSB1 may be valid read voltages.

The memory system 10 may select, as a target threshold voltage distribution, the threshold voltage distribution 72 that is adjacent to the valid read voltage MSB0 in a voltage decrease direction and that is adjacent to the invalid read voltage LSB0 in a voltage increase direction. Alternatively, the memory system 10 may select, as a target threshold voltage distribution, a lower threshold voltage distribution (i.e., the threshold voltage distribution 72) among the adjacent lower and higher threshold voltage distributions 72 and 73 distinguished by the invalid read voltage LSB0. The memory system may shift the target threshold voltage distribution 72 to a threshold voltage distribution 72S through an adjustment program operation.

Furthermore, the memory system 10 may raise the valid read voltage MSB0 adjacent to the target threshold voltage distribution 72 to a read voltage MSB0S. The memory system 10 may use the adjusted read voltage MSB0S and the read voltage MSB1 when performing read operations on the MSB pages.

FIG. 7C illustrates a method of performing an adjustment program operation when MSB pages are invalid pages and an LSB page is a valid page. Since the MSB pages are invalid pages, the read voltages MSB0 and MSB1 may be invalid read voltages, and the read voltage LSB0 may be a valid read voltage.

The memory system 10 may select, as a target threshold voltage distribution, the threshold voltage distribution 73 that is adjacent to the valid read voltage LSB0 in the voltage decrease direction and that is adjacent to the invalid read voltage MSB1 in the voltage increase direction. Alternatively, the memory system 10 may select, as a target threshold voltage distribution, a lower threshold voltage distribution (i.e., the threshold voltage distribution 73) between the lower and higher threshold voltage distributions 73 and 74 distinguished by the invalid read voltage MSB1. The memory system 10 may shift the target threshold voltage distribution 73 to a threshold voltage distribution 73S through an adjustment program operation.

A lower threshold voltage distribution (i.e., the threshold voltage distribution 71) among the lower and higher threshold voltage distributions 71 and 72 distinguished by the invalid read voltage MSB0 may not be selected as a target threshold voltage distribution. The reason for this is that the shift of the threshold voltage distribution 71 does not cause the increase of a read margin.

Furthermore, the memory system 10 may raise the valid read voltage LSB0 adjacent to the target threshold voltage distribution 73 to an adjusted read voltage LSB0S. The memory system 10 may use the adjusted read voltage LSB0S when performing a read operation on the LSB page.

Figure 8B:
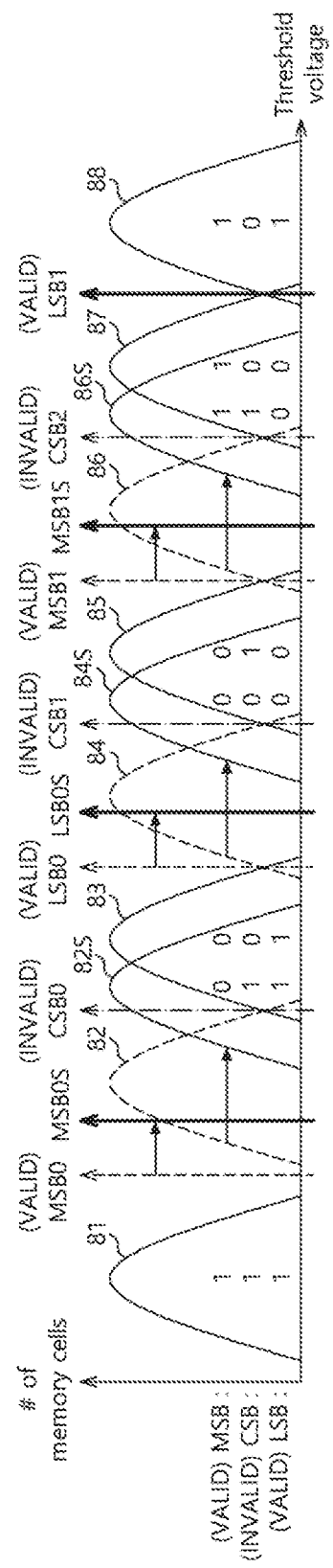

FIGS. 8A to 8C are diagrams illustrating operations of the memory system according to an embodiment of the present disclosure.

FIG. 8A illustrates an example of eight threshold voltage distributions 81 to 88 formed in memory cells if the memory cells are TLCs. The threshold voltage distribution 81 may be formed by memory cells in which data "111", for example, is stored. The threshold voltage distribution 82 may be formed by memory cells in which data "011", for example, is stored. The threshold voltage distribution 83 may be formed by memory cells in which data "001", for example, is stored. The threshold voltage distribution 84 may be formed by memory cells in which data "000", for example, is stored. The threshold voltage distribution 85 may be formed by memory cells in which data "010", for example, is stored. The threshold voltage distribution 86 may be formed by memory cells in which data "110", for example, is stored. The threshold voltage distribution 87 may be formed by memory cells in which data "100", for example, is stored. The threshold voltage distribution 88 may be formed by memory cells in which data "101", for example, is stored.

The threshold voltage distributions 81 to 88 may be distinguished by preset read voltages MSB0, CSB0, LSB0, CSB1, MSB1, CSB2, and LSB1. The read voltages LSB0 and LSB1 may be used to read data stored in the LSB pages by distinguishing between the threshold voltage distributions 83 and 84 and between the threshold voltage distributions 87 and 88, respectively. The read voltages CSB0, CSB1 and CSB2 may be used to read data stored in the CSB pages by distinguishing between the threshold voltage distributions 82 and 83, between the threshold voltage distributions 84 and 85 and between the threshold voltage distributions 86 and 87, respectively. The read voltages MSB0 and MSB1 may be used to read data stored in the MSB pages by distinguishing between the threshold voltage distributions 81 and 82 and between the threshold voltage distributions 85 and 86, respectively.

FIG. 8B illustrates a method of performing an adjustment program operation when only CSB pages among the LSB pages, CSB pages and the MSB pages are invalid pages.

Similar to the above description regarding FIG. 7A to 7C, the memory system 10 may select, as a target threshold voltage distribution, the threshold voltage distribution 82 that is adjacent to the valid read voltage MSB0 in a voltage decrease direction and that is adjacent to the invalid read voltage CSB0 in a voltage increase direction. Furthermore, the memory system 10 may select, as a target threshold voltage distribution, the threshold voltage distribution 84 that is adjacent to the valid read voltage LSB0 in the voltage decrease direction and that is adjacent to the invalid read voltage CSB1 in the voltage increase direction. Furthermore, the memory system 10 may select, as a target threshold voltage distribution, the threshold voltage distribution 86 that is adjacent to the valid read voltage MSB1 in the voltage decrease direction and that is adjacent to the invalid read voltage CSB2 in the voltage increase direction.

Alternatively, the memory system 10 may select, as a target threshold voltage distribution, a lower threshold voltage distribution (i.e., the threshold voltage distribution 82) among the lower and higher threshold voltage distributions 82 and 83 distinguished by the invalid read voltage CSB0. Furthermore, the memory system 10 may select, as a target threshold voltage distribution, a lower threshold voltage distribution (i.e., the threshold voltage distribution 84) among the lower and higher threshold voltage distributions 84 and 85 distinguished by the invalid read voltage CSB1. Furthermore, the memory system 10 may select, as a target threshold voltage distribution, a lower threshold voltage distribution (i.e., the threshold voltage distribution 86) among the lower and higher threshold voltage distributions 86 and 87 distinguished by the invalid read voltage CSB2.

The memory system 10 may shift the target threshold voltage distributions 82, 84 and 86 to respective threshold voltage distributions 82S, 84S and 86S through an adjustment program operation.

Furthermore, the memory system 10 may raise the valid read voltages MSB0, LSB0 and MSB1 adjacent to the target threshold voltage distributions 82, 84 and 86 to read voltages MSB0S, LSB0S and MSB1S, respectively. The memory system 10 may use the adjusted read voltage LSB0S and the read voltage LSB1 when performing read operations on the LSB pages. Furthermore, the memory system 10 may use the adjusted read voltages MSB0S and MSB1S when performing read operations on the MSB pages.

FIG. 8C illustrates a method of performing an adjustment program operation when the CSB pages and MSB pages among the LSB pages, the CSB pages and the MSB pages are invalid pages.

The memory system 10 may select, as a target threshold voltage distribution, the threshold voltage distribution 84 that is adjacent to the valid read voltage LSB0 in the voltage decrease direction and that is adjacent to the invalid read voltage CSB1 in the voltage increase direction. The memory system 10 may shift the target threshold voltage distribution 84 to a threshold voltage distribution 84S through an adjustment program operation.

Alternatively, when two or more invalid read voltages are adjacent to each other, the memory system 10 may select, as a target threshold voltage distribution, a lower threshold voltage distribution of the two adjacent threshold voltage distributions distinguished by the lowest invalid read voltage among the two or more adjacent invalid read voltages. That is, as illustrated in FIG. 8C, the threshold voltage distribution 84 may be selected as a target threshold voltage distribution based on the lowest invalid read voltage CSB1 of the adjacent invalid read voltages CSB1, MSB1 and CSB2.

The threshold voltage distribution 81 may not be selected as a target threshold voltage distribution because a read margin is not increased although the threshold voltage distribution 81 is shifted as described above.

Furthermore, the memory system 10 may raise the valid read voltage LSB0 adjacent to the target threshold voltage distribution 84 to a read voltage LSB0S. The memory system 10 may use the adjusted read voltage LSB0S and the read voltage LSB1 when performing read operations on the LSB pages.

Figure 9:
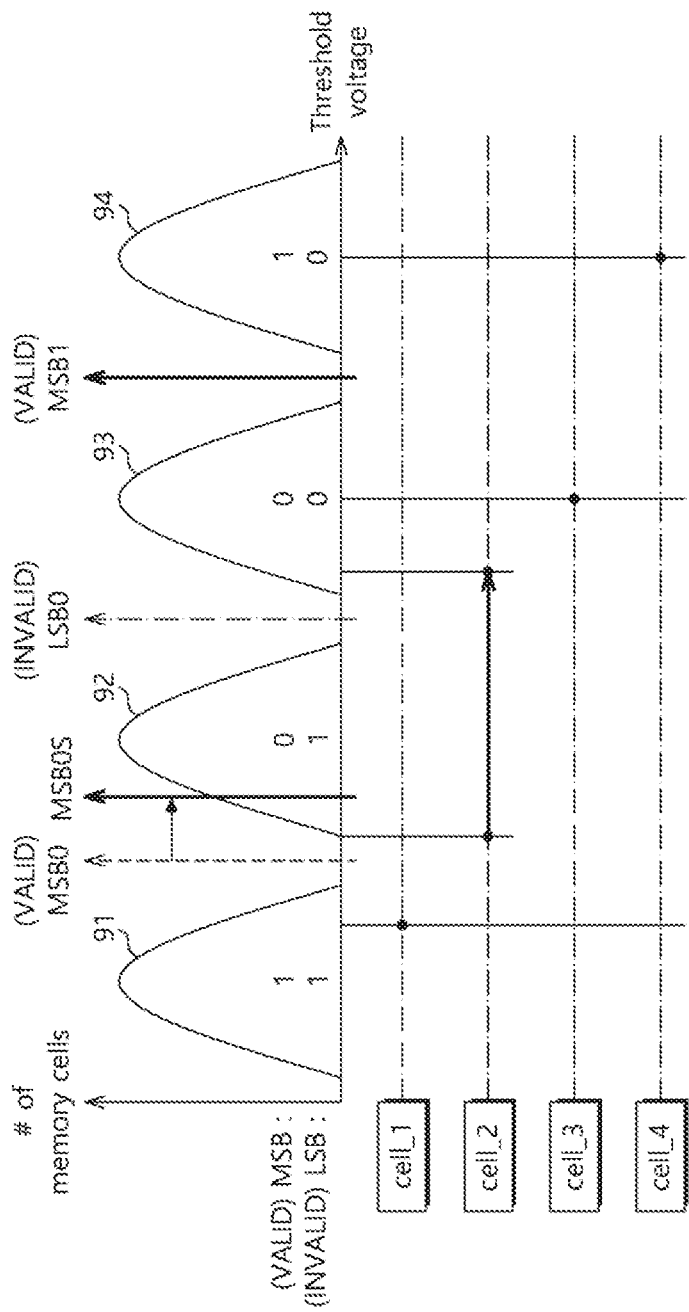
FIG. 9 is a diagram illustrating an operation of the memory system according to an embodiment of the present disclosure.

FIG. 9 is a diagram for illustrating an operation of the memory system according to an embodiment of this disclosure.

FIG. 9 illustrates threshold voltage distributions 91 to 94 of a page group which physically includes four MLC memory cells cell_1 to cell_4 and logically includes an LSB page and MSB pages. The memory cell cell_1 represents memory cells that have been programmed to have a threshold voltage corresponding to the threshold voltage distribution 91, the memory cell cell_2 represents memory cells that have been programmed to have a threshold voltage corresponding to the threshold voltage distribution 92, the memory cell cell_3 represents memory cells that have been programmed to have a threshold voltage corresponding to the threshold voltage distribution 93, and the memory cell cell_4 represents memory cells that have been programmed to have a threshold voltage corresponding to the threshold voltage distribution 94.

If data stored in the LSB page of the LSB page and MSB pages is invalidated, distinguishing the threshold voltage distribution 92 and the threshold voltage distribution 93 may be meaningless. Accordingly, the memory system 10 may select, as a target memory cell, the memory cell cell_2 having a threshold voltage belonging to a lower threshold voltage distribution (i.e., the threshold voltage distribution 92) among the threshold voltage distribution 92 and the threshold voltage distribution 93. The memory system 10 may shift the threshold voltage of the target memory cell cell_2 by a voltage belonging to the threshold voltage distribution 93 through an adjustment program operation. Furthermore, the memory system 10 may raise the read voltage MSB0 for distinguishing between the threshold voltage distributions 91 and 92 to a read voltage MSB0S because the interval between the threshold voltage distributions 91 and 92 is increased. Accordingly, an error in MSBs stored in the memory cells cell_1 and cell_2 can be reduced when read operations are performed on the MSBs because a read margin between the threshold voltage distributions 91 and 92 is increased.

Figure 10:
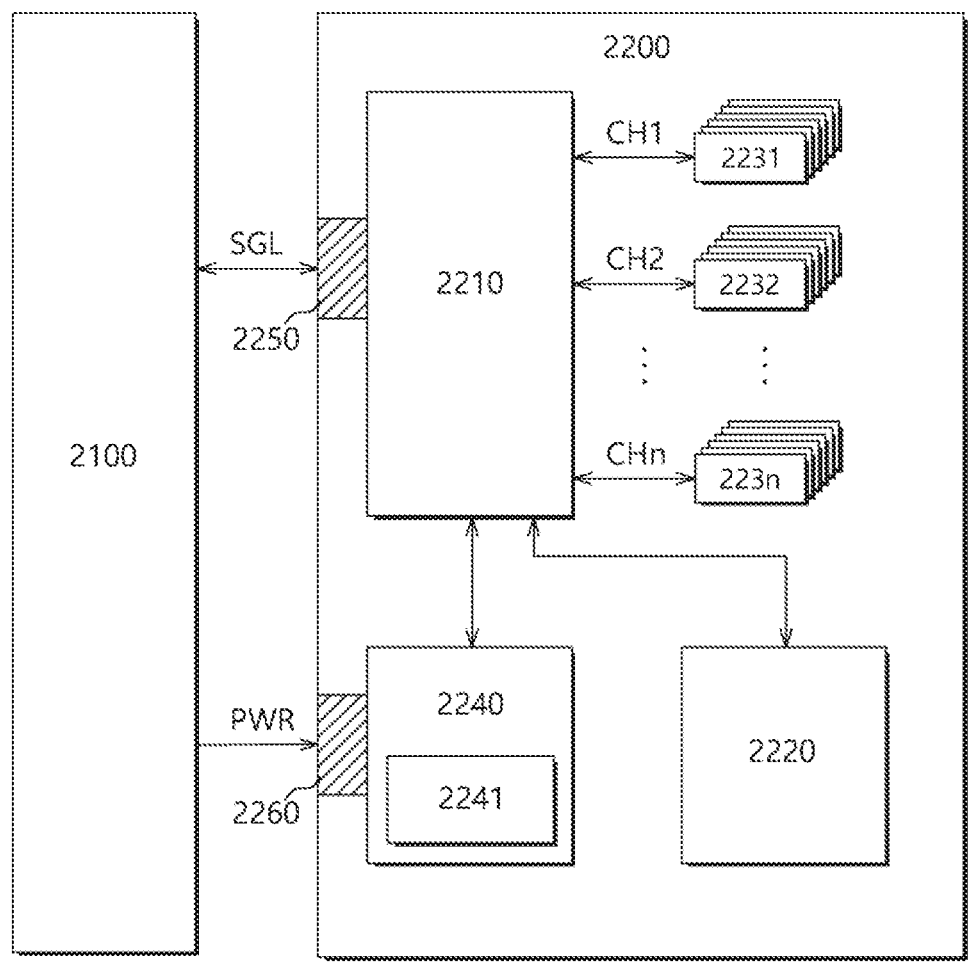
FIG. 10 is a diagram illustrating a configuration of a data processing system including a solid state drive (SSD) in accordance with an embodiment of the present disclosure.

FIG. 10 is a diagram illustrating a configuration of a data processing system including a solid state drive (SSD) in accordance with an embodiment of the present disclosure. Referring to FIG. 10, a data processing system 2000 may include a host 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2200. The controller 2210 may be implemented and operate in the substantially same way as the controller 200 of FIG. 1.

The buffer memory device 2220 may temporarily store data to be stored in the nonvolatile memory devices 2231 to 223n. Further, the buffer memory device 2220 may temporarily store data read out from the nonvolatile memory devices 2231 to 223n. The data temporarily stored in the buffer memory device 2220 may be transmitted to the host 2100 or the nonvolatile memory devices 2231 to 223n according to control of the controller 2210.

The nonvolatile memory devices 2231 to 223n may be used as storage media of the SSD 2200. The nonvolatile memory devices 2231 to 223n may be electrically coupled to the controller 2210 through a plurality of channels CH1 to CHn, respectively. One or more nonvolatile memory devices may be coupled to a single channel. The nonvolatile memory devices coupled to the single channel may be coupled to the same signal bus and data bus.

The power supply 2240 may provide the inside of the SSD 2200 with power PWR inputted through the power connector 2260. The power supply 2240 may include an auxiliary power supply 2241. The auxiliary power supply 2241 may supply power to allow the SSD 2200 to be normally terminated when sudden power-off (SPO) occurs. The auxiliary power supply 2241 may include large capacity capacitors capable of charging the power PWR.

The controller 2210 may exchange a signal SGL with the host 2100 through the signal connector 2250. The signal SGL may include a command, an address, data, and the like. The signal connector 2250 may be configured of various types of connectors according to an interface scheme between the host 2100 and the SSD 2200.

Figure 11:
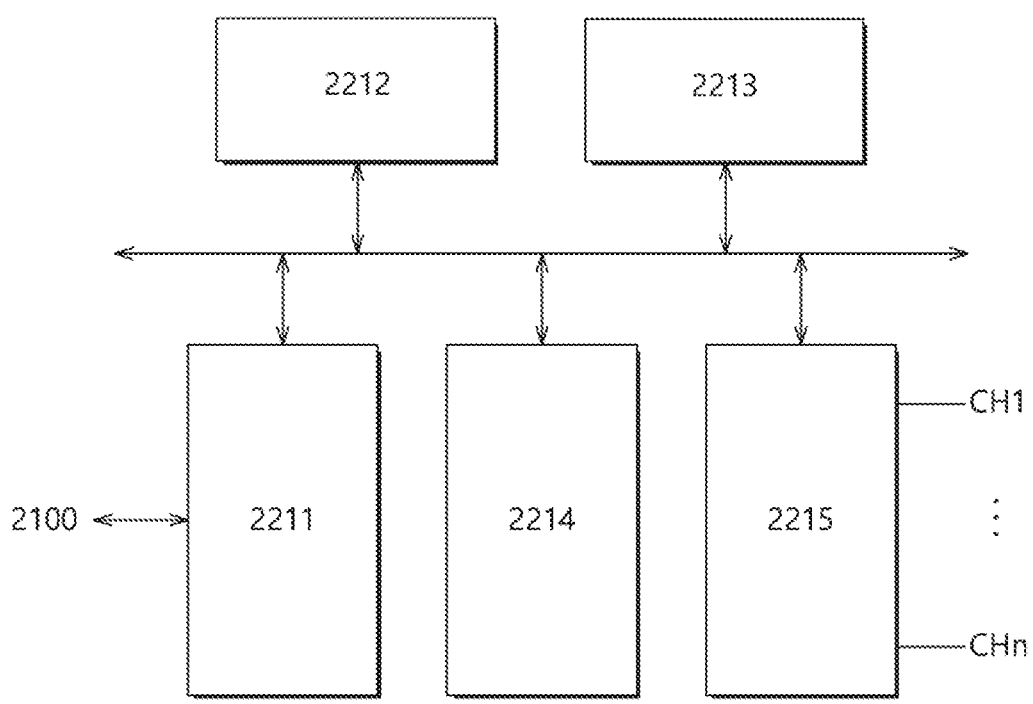
FIG. 11 is a diagram illustrating a configuration of a controller illustrated in FIG. 10.

FIG. 11 is a diagram illustrating a configuration of the controller illustrated in FIG. 10. Referring to FIG. 11, the controller 2210 may include a host interface 2211, a control component 2212, a random access memory 2213, an error correction code (ECC) component 2214, and a memory interface 2215.

The host interface 2211 may perform interfacing between the host 2100 and the SSD 2200 according to a protocol of the host 2100. For example, the host interface 2211 may communicate with the host 2100 through any one among protocols of secure digital (SD), universal serial bus (USB), multi-media card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-E), universal flash storage (UFS) and so forth. In addition, the host interface 2211 may perform a disk emulating function of supporting the host 2100 to recognize the SSD 2200 as a general-purpose memory system, for example, a hard disk drive (HDD).

The control component 2212 may parse and process the signal SGL provided from the host 2100. The control component 2212 may control operations of internal function blocks according to firmware or software for driving the SSD 2200. The random access memory 2213 may operate as a working memory for driving such firmware or software.

The ECC component 2214 may generate parity data for data to be transmitted to the nonvolatile memory devices 2231 to 223n. The generated parity data may be stored, along with the data, in the nonvolatile memory devices 2231 to 223n. The ECC component 2214 may detect errors of data read out from the nonvolatile memory devices 2231 to 223n based on the parity data. When the detected errors are within a correctable range, the ECC component 2214 may correct the detected errors.

The memory interface 2215 may provide control signals such as commands and addresses to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read out from the nonvolatile memory devices 2231 to 223n to the buffer memory device 2220.

Figure 12:
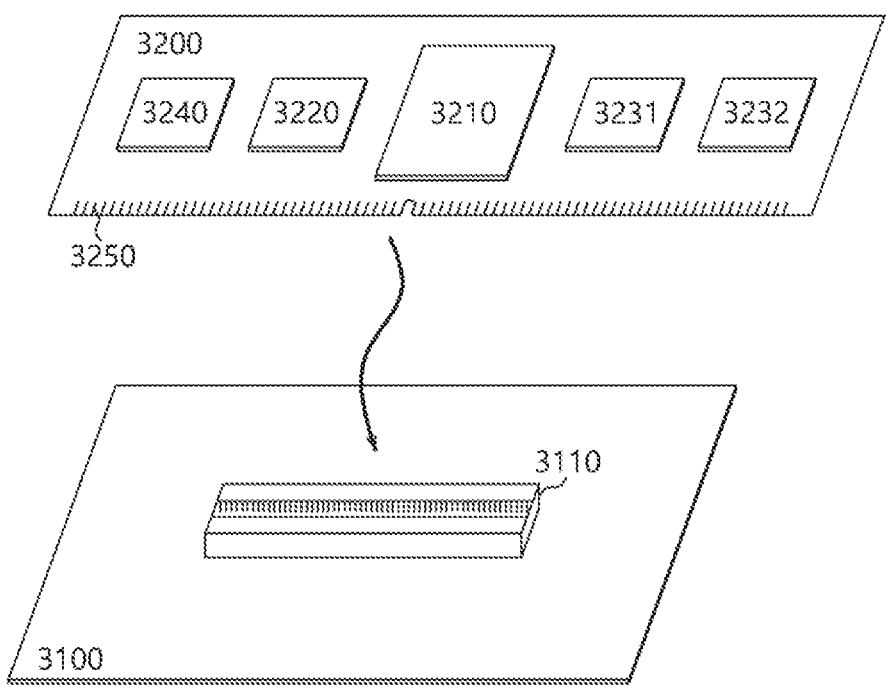
FIG. 12 is a diagram illustrating a configuration of a data processing system including a memory system in accordance with an embodiment of the present disclosure.

FIG. 12 is a diagram illustrating a configuration of a data processing system including a memory system in accordance with an embodiment of the present disclosure. Referring to FIG. 12, a data processing system 3000 may include a host 3100 and a memory system 3200.

The host 3100 may be configured in the form of a board such as a printed circuit board. Although not shown in FIG. 12, the host 3100 may include internal function blocks for performing functions of a host.

The host 3100 may include a connection terminal 3110 such as a socket, a slot, or a connector. The memory system 3200 may be mounted on the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control an overall operation of the memory system 3200. The controller 3210 may be configured in substantially same manner as the controller 2210 shown in FIG. 11.

The buffer memory device 3220 may temporarily store data to be stored in the nonvolatile memory devices 3231 and 3232. Further, the buffer memory device 3220 may temporarily store data read out from the nonvolatile memory devices 3231 and 3232. The data temporarily stored in the buffer memory device 3220 may be transmitted to the host 3100 or the nonvolatile memory devices 3231 and 3232 according to control of the controller 3210.

The nonvolatile memory devices 3231 and 3232 may be used as storage media of the memory system 3200.

The PMIC 3240 may provide the inside of the memory system 3200 with power inputted through the connection terminal 3250. The PMIC 3240 may manage the power of the memory system 3200 according to control of the controller 3210.

The connection terminal 3250 may be electrically coupled to the connection terminal 3110 of the host 3100. Through the connection terminal 3250, signals such as commands, addresses, data and the like, and power may be transferred between the host 3100 and the memory system 3200. The connection terminal 3250 may be configured as various types depending on an interface scheme between the host 3100 and the memory system 3200. The connection terminal 3250 may be disposed on any one side of the memory system 3200.

Figure 13:
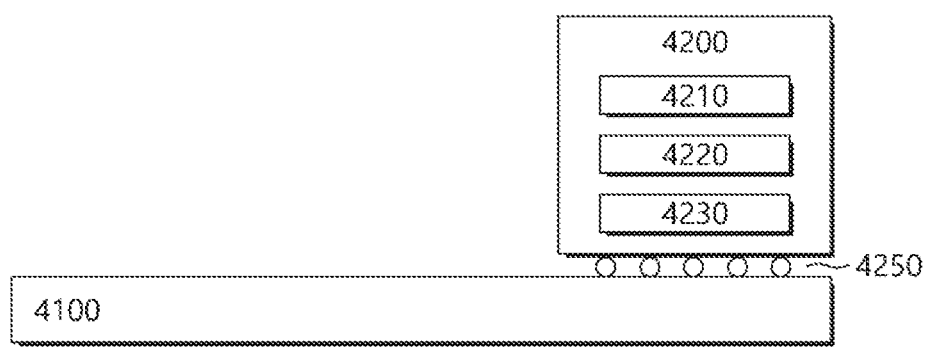
FIG. 13 is a diagram illustrating a configuration of a data processing system including a memory system in accordance with an embodiment of the present disclosure.

FIG. 13 is a diagram illustrating a configuration of a data processing system including a memory system in accordance with an embodiment of the present disclosure. Referring to FIG. 13, the data processing system 4000 may include a host 4100 and a memory system 4200.

The host 4100 may be configured in the form of a board such as a printed circuit board. Although not shown in FIG. 13, the host 4100 may include internal function blocks for performing functions of a host.

The memory system 4200 may be configured in the form of a package of a surface-mounting type. The memory system 4200 may be mounted on the host 4100 through solder balls 4250. The memory system 4200 may include a controller 4210, a buffer memory device 4220, and a nonvolatile memory device 4230.

The controller 4210 may control an overall operation of the memory system 4200. The controller 4210 may be configured in substantially same manner as the controller 2210 shown in FIG. 11.

The buffer memory device 4220 may temporarily store data to be stored in the nonvolatile memory device 4230. Further, the buffer memory device 4220 may temporarily store data read out from the nonvolatile memory device 4230. The data temporarily stored in the buffer memory device 4220 may be transmitted to the host 4100 or the nonvolatile memory device 4230 according to control of the controller 4210.

The nonvolatile memory device 4230 may be used as a storage medium of the memory system 4200.

Figure 14:
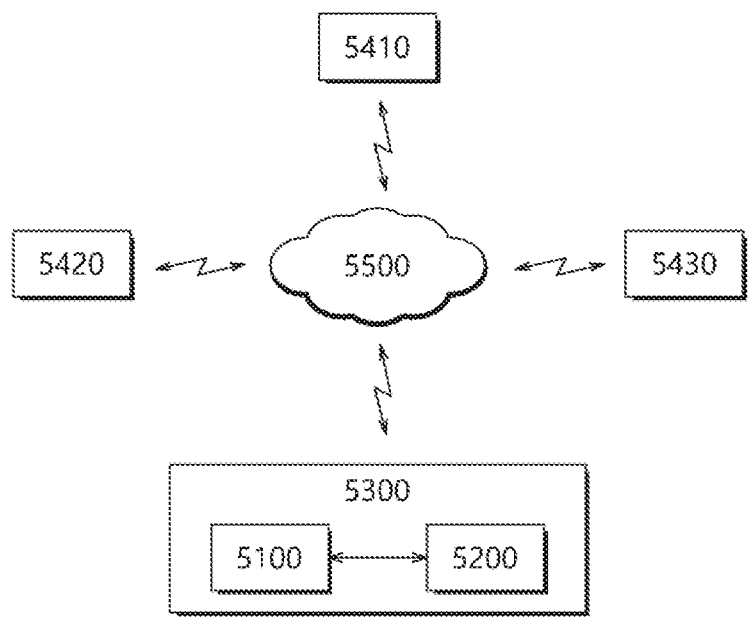
FIG. 14 is a diagram illustrating a configuration of a network system including a memory system in accordance with an embodiment of the present disclosure.

FIG. 14 is a diagram illustrating a configuration of a network system 5000 including a memory system in accordance with an embodiment of the present disclosure. Referring to FIG. 14, the network system 5000 may include a server system 5300 and a plurality of client systems 5410 to 5430 which are electrically coupled to each other through a network 5500.

The server system 5300 may service data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host 5100 and a memory system 5200. The memory system 5200 may be configured as the memory system 10 illustrated in FIG. 1, the memory system 2200 illustrated in FIG. 11, the memory system 3200 illustrated in FIG. 12, or the memory system 4200 illustrated in FIG. 13.

Those skilled in the art to which this disclosure pertains should understand that the embodiments are only illustrative from all aspects not being limitative because this disclosure may be implemented in various other forms without departing from the technical spirit or essential characteristics of this disclosure. Accordingly, the scope of this disclosure is defined by the appended claims rather than by the detailed description, and all modifications or variations derived from the meanings and scope of the claims and equivalents thereof should be understood as being included in the scope of this disclosure.

While various embodiments have been described above, it will be understood to those skilled in the art that the embodiments described are by way of example only. Accordingly, the controller of the semiconductor apparatus and the operating method thereof described herein should not be limited based on the described embodiments.

What is claimed is:

1. A controller for controlling a non-volatile memory apparatus comprising page groups each comprising a plurality of pages, wherein the controller is configured to:
   select a target page group from the page groups, wherein the target page group comprises at least one invalid page and at least one valid page,
   select, as a target threshold voltage distribution, a lower threshold voltage distribution of lower and higher threshold voltage distributions distinguished by an invalid read voltage, wherein the invalid read voltage is a read voltage for distinguishing data stored in the invalid page,
   select, as a target memory cell, a memory cell having a threshold voltage belonging to the target threshold voltage distribution among a plurality of memory cells configuring the target page group, and
   control the non-volatile memory apparatus to perform an adjustment program operation for raising the threshold voltage of the target memory cell as much as a first voltage.

2. The controller according to claim 1, wherein the controller controls the non-volatile memory apparatus to perform the adjustment program operation for raising the threshold voltage of the target memory cell as much as the first voltage such that the threshold voltage of the target memory cell does not exceed the higher threshold voltage distribution of the lower and the higher threshold voltage distributions after the adjustment program operation is performed.

3. The controller according to claim 1, wherein the controller controls the non-volatile memory apparatus to perform the adjustment program operation for raising the threshold voltage of the target memory cell as much as the first voltage such that the threshold voltage of the target memory cell becomes higher than the invalid read voltage after the adjustment program operation is performed.

4. The controller according to claim 1, wherein the adjustment program operation is performed when data stored in the valid page includes cold data.

5. The controller according to claim 1, wherein:
   the controller is further configured to raise, after the adjustment program operation is performed, a valid read voltage adjacent to the target threshold voltage distribution as much as a second voltage, and
   the valid read voltage is a read voltage for distinguishing data stored in the valid page.

6. A controller for controlling a non-volatile memory apparatus comprising page groups each comprising three or more pages, wherein the controller is configured to:
   select a target page group from the page groups, wherein the target page group comprises at least two invalid pages and at least one valid page,
   select, as a target threshold voltage distribution, a lower threshold voltage distribution of two adjacent threshold voltage distributions distinguished by respective invalid read voltages, wherein the invalid read voltages are read voltages for distinguishing data stored in the invalid pages,
   select, as a target memory cell, a memory cell having a threshold voltage belonging to the target threshold voltage distribution among a plurality of memory cells configuring the target page group, and
   control the non-volatile memory apparatus to perform an adjustment program operation for raising the threshold voltage of the target memory cell as much as a first voltage.

7. The controller according to claim 6, wherein the controller controls the non-volatile memory apparatus to perform the adjustment program operation for raising the threshold voltage of the target memory cell as much as the first voltage such that the threshold voltage of the target memory cell does not exceed the higher threshold voltage distribution of the two adjacent threshold voltage distributions after the adjustment program operation is performed.

8. The controller according to claim 6, wherein the controller controls the non-volatile memory apparatus to perform the adjustment program operation for raising the threshold voltage of the target memory cell as much as the first voltage such that the threshold voltage of the target memory cell becomes higher than an invalid read voltage that is adjacent in a voltage increase direction of the target threshold voltage distribution after the adjustment program operation is performed.

9. The controller according to claim 6, wherein:
   when the invalid read voltages comprise two or more adjacent invalid read voltages, the controller selects as the target threshold voltage distribution a lower threshold voltage distribution of the two adjacent threshold voltage distributions distinguished by a first read voltage, and
   the first read voltage is a lowest invalid read voltage of the two or more adjacent invalid read voltages.

10. The controller according to claim 6, wherein the adjustment program operation is performed when data stored in the valid page includes cold data.

11. The controller according to claim 6, wherein the adjustment program operation is performed when the target page group is determined to stay in a partially invalid state based on a time interval for each of the invalid pages to be invalidated.

12. The controller according to claim 6, wherein:
   the controller is further configured to raise, after the adjustment program operation is performed, a valid read voltage adjacent to the target threshold voltage distribution as much as a second voltage, and
   the valid read voltage is a read voltage for distinguishing data stored in the valid page.

13. A controller for controlling a non-volatile memory apparatus comprising page groups each comprising a plurality of pages, wherein the controller is configured to:
- select a target page group from the page groups, wherein the target page group comprises at least one invalid page and at least one valid page,
- select, as a target threshold voltage distribution, a threshold voltage distribution located between adjacent valid and invalid read voltages,
- select, as a target memory cell, a memory cell having a threshold voltage belonging to the target threshold voltage distribution among a plurality of memory cells configuring the target page group, and
- control the non-volatile memory apparatus to perform an adjustment program operation for raising the threshold voltage of the target memory cell.

14. The controller according to claim 13, wherein the adjustment program operation is performed so that the threshold voltage of the target memory cell does not exceed a first threshold voltage distribution adjacent in a voltage increase direction of the target threshold voltage distribution.

15. The controller according to claim 13, wherein the adjustment program operation is performed when data stored in the valid page includes cold data.

16. The controller according to claim 13, wherein the adjustment program operation is performed when the target page group is determined to stay in a partially invalid state based on a time interval for each of invalid pages included in the target page group to be invalidated.

17. The controller according to claim 13, wherein:
when each of the plurality of memory cells is a triple level cell (TLC), and each of the page groups comprises a most significant bit (MSB) page, a center significant bit (CSB) page and a least significant bit (LSB) page, the controller selects, as the target page group, a page group in which any one or two of the MSB page, the CSB page, and the LSB page are invalid pages.

18. The controller according to claim 13, wherein the controller is further configured to raise, after the adjustment program operation is performed, the valid read voltage as much as a second voltage.

19. A memory system comprising;
- a memory device including multiple level pages comprising one or more invalid pages and one or more valid pages; and
- a controller configured to control the memory device to raise a threshold voltage of a memory cell,
- wherein the threshold voltage of the memory cell is between neighboring lower and first higher read voltages, which respectively identify data stored in the valid and invalid pages,
- wherein the threshold voltage of the memory cell is raised not to exceed a second higher read voltage, which is adjacent to and higher than the first higher read voltage and identifies data stored in the valid pages, to identify data stored in the memory cell of the raised threshold voltage, and
- wherein the controller is further configured to control the memory device to raise the lower read voltage to identify data stored in the memory cell of the raised threshold voltage.

* * * * *